United States Patent [19]

Stillwell et al.

[11] 4,384,289

[45] May 17, 1983

[54] TRANSPONDER UNIT FOR MEASURING TEMPERATURE AND CURRENT ON LIVE TRANSMISSION LINES

[75] Inventors: Howard R. Stillwell, Pittsfield, Mass.; Roosevelt A. Fernandes, Liverpool, N.Y.

[73] Assignee: General Electric Company

[21] Appl. No.: 227,809

[22] Filed: Jan. 23, 1981

[51] Int. Cl.³ .............................................. G08C 19/00
[52] U.S. Cl. ................................ 340/870.17; 324/126; 374/170
[58] Field of Search ................... 340/870.17, 584, 595, 340/596; 73/359 R, 362 R, 340, 342; 324/126, 127; 374/179, 170

[56] References Cited

U.S. PATENT DOCUMENTS

| | | | |
|---|---|---|---|
| 3,428,896 | 2/1969 | Schweitzer | 324/127 |
| 3,874,239 | 4/1975 | Finney | 73/359 |
| 4,158,810 | 6/1979 | Leskovar | 324/127 |
| 4,268,818 | 5/1981 | Davis et al. | 340/870.17 |
| 4,316,142 | 2/1982 | Kuramoto | 324/127 |

OTHER PUBLICATIONS

"A New Thermal Rating Approach", *IEEE Power Engineering Society*, Davis, Apr. 26, 1976.
"A New Thermal Rating Approach", *IEEE Power Engineering Society*, Davis, May 14, 1979.
"A New Thermal Rating Approach", *IEEE Power Engineering Society*, Davis, Mar. 30, 1977.

*Primary Examiner*—James J. Groody
*Attorney, Agent, or Firm*—Robert A. Cahill

[57] ABSTRACT

A toroidal shaped transponder unit is connected to a live power transmission line by means of a tripping mechanism and a hinge assembly. The unit includes means for sensing the temperature and current of the power transmission line and for transmitting the information to a local receiver. The toroid housing includes an open frame mounting hub and spoke assembly for mounting the sensors without interfering with the thermodynamics of the transmission line. The unit further includes a power coil and core assembly for receiving magnetic emanations from the transmission line and generating power to operate the electronic components within the unit.

6 Claims, 8 Drawing Figures

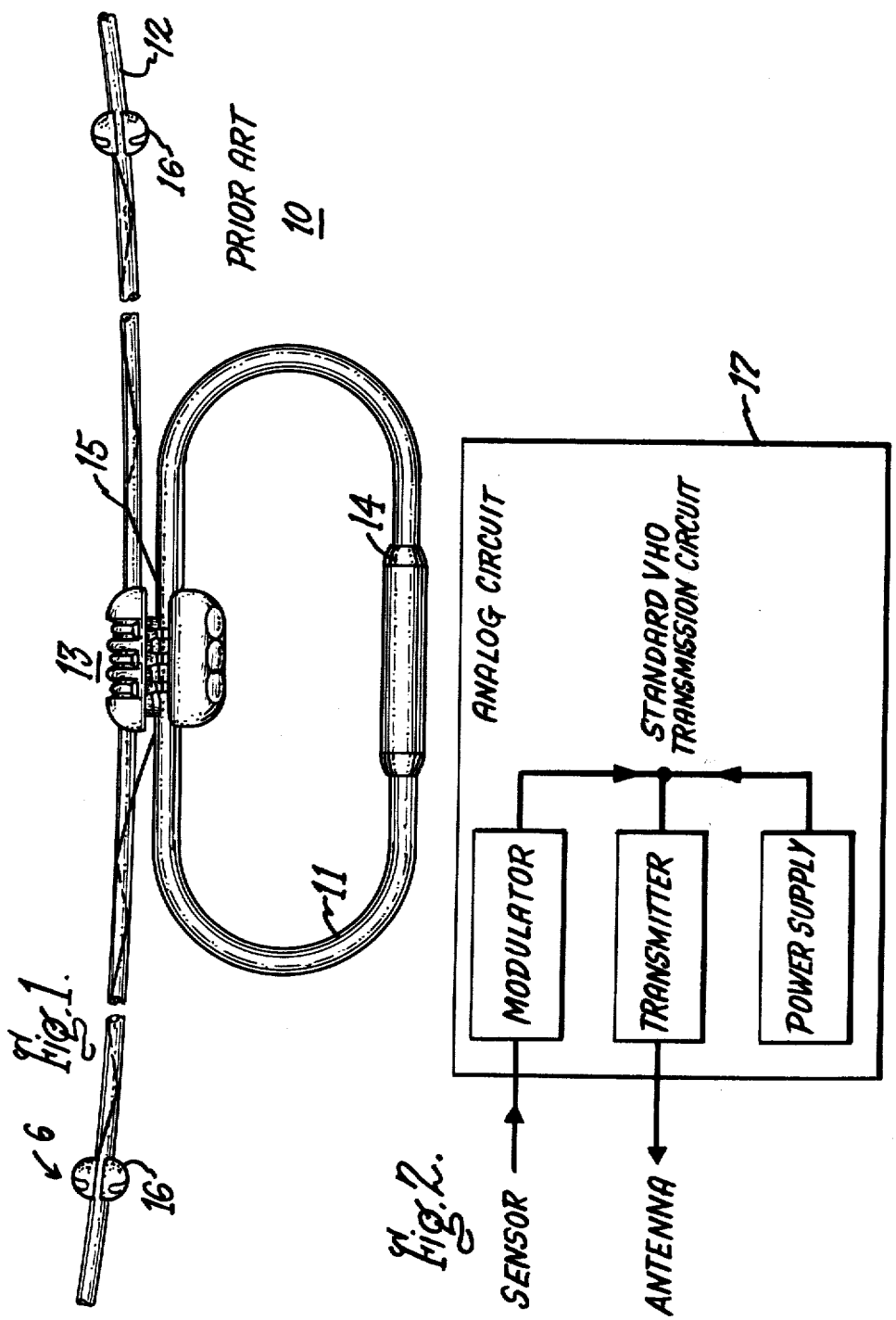

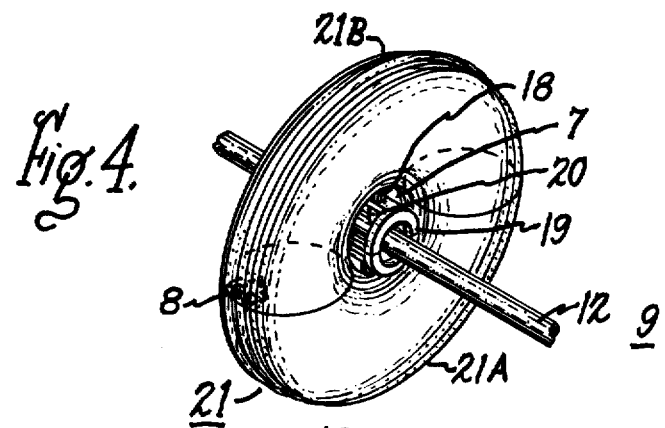
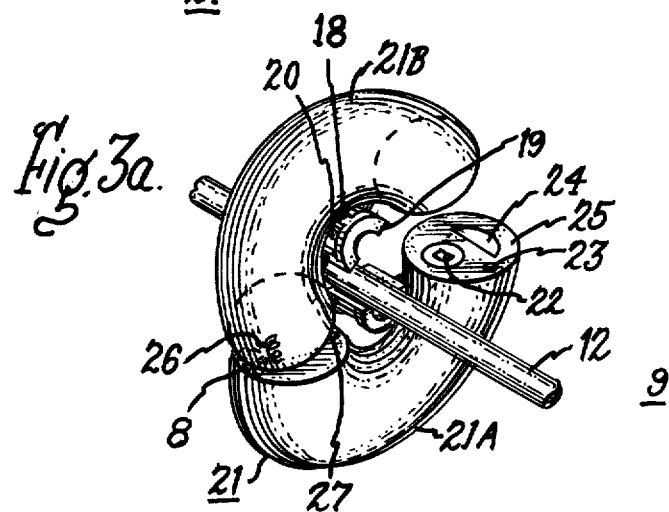
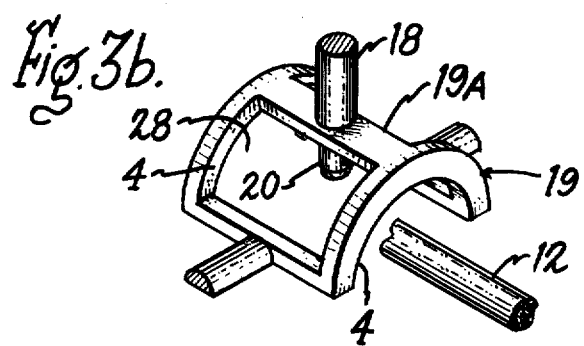

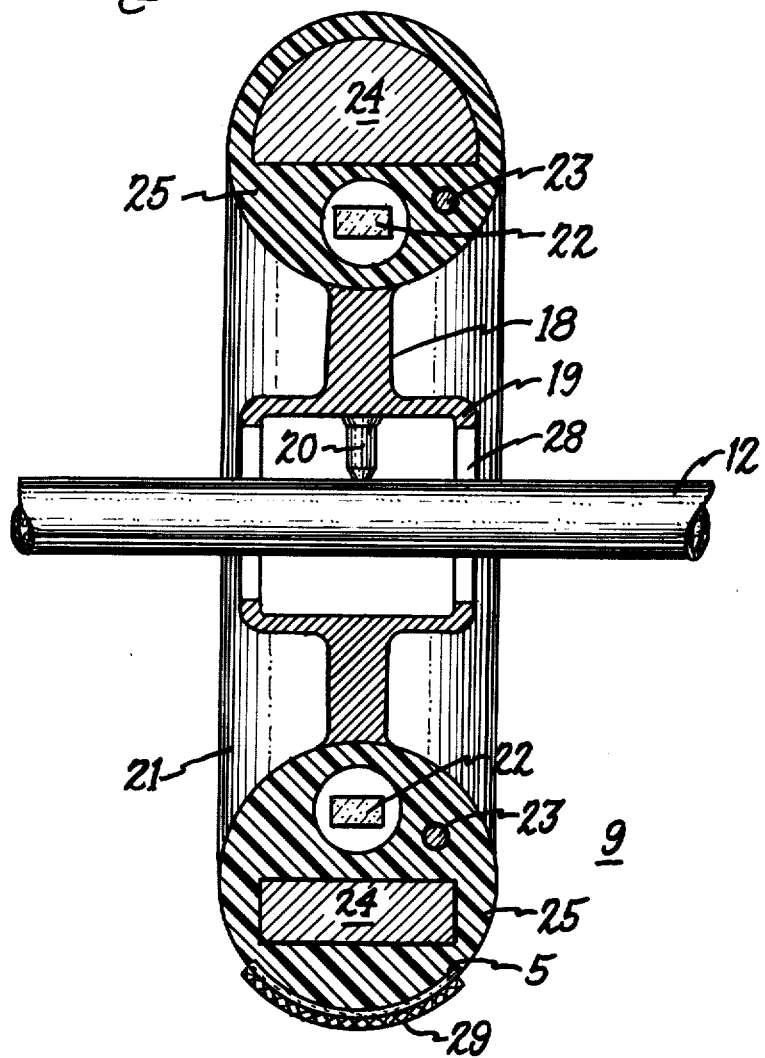

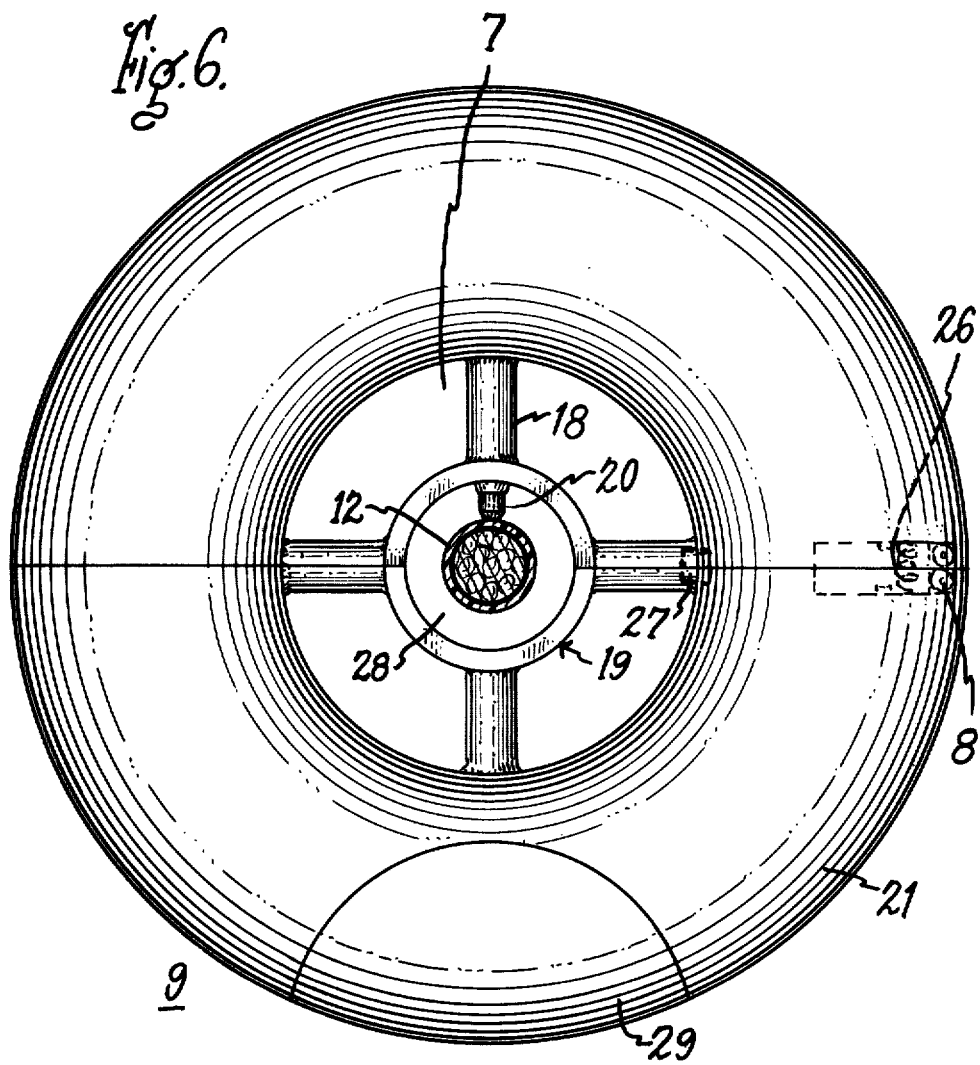

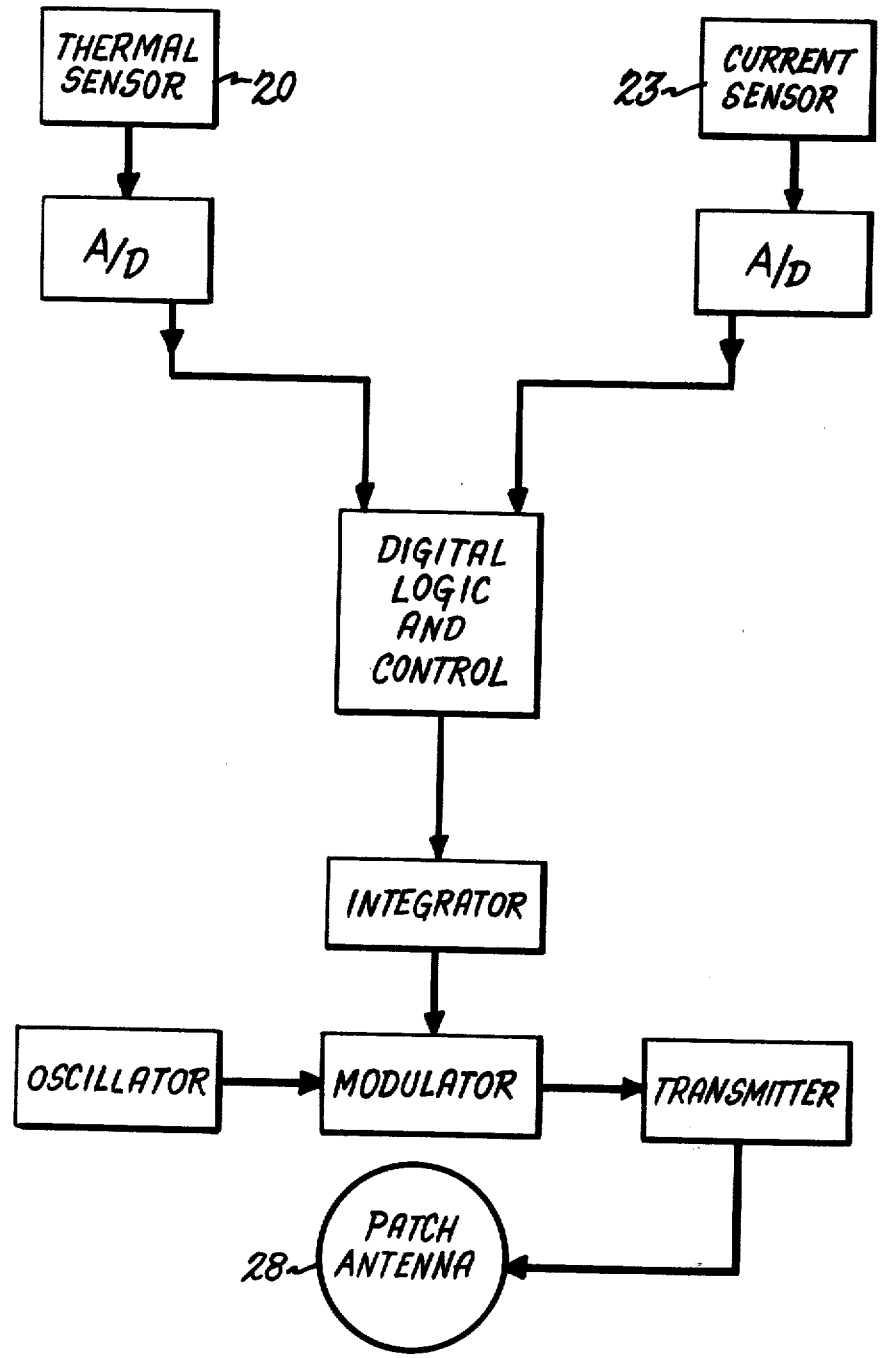

TRANSPONDER UNIT FOR MEASURING TEMPERATURE AND CURRENT ON LIVE TRANSMISSION LINES

BACKGROUND OF THE INVENTION

Transponder units are currently available for sensing the operating temperature of a power transmission line and for monitoring the current through the transmission line on a continuous basis. The information is transmitted by means of a radio frequency transmitter to a local receiver for evaluation as to the condition of the transmission line under periods of heavy loading. The transponder unit generally comprises a closed loop of a metallic tubular material which includes the radio transmitter and power supply elements. The loop housing is attached to the transmission line by means of a housing clamp which must be connected to the transmission line when the line is de-energized. The radio frequency antenna generally comprises a linear extent of antenna wire wrapped around the transmission line and attached to the line by means of an insulated antenna clamp. The power supply and transmitter circuit comprises an analog circuit coupled with a modulator connected to the thermal and current sensors for obtaining the necessary electrical and thermal data. The conductor temperature is obtained from a thermocouple mounted opposite from the antenna. The modulator is connected to a standard radio frequency transmitter and antenna for transmitting the electrical and thermal data to a nearby receiver. The power supply within the circuit is powered by means of the electricity generated within the loop housing by means of the varying magnetic field surrounding the power transmission line. Since the tubular housing provides the means for intercepting the surrounding magnetic field or air flux for generating electric power, the closed loop must be in the order of a few feet in circumference in order to provide enough electrical energy from the magnetic field to power the necessary electronic circuit components in the unit. The use of a radio frequency transmitter requires a radio frequency antenna several feet long for efficient transmission to a receiver located as far as fifty feet from the power transmission line.

The purpose of this invention is to provide a transponder unit for sensing the current through a transmission line, as well as the transmission line temperature, without having to de-energize the transmission line during installation, removal and repair. The improved transponder unit is more compact in view of its improved magnetic power loop and ultrahigh frequency transmitter.

SUMMARY OF THE INVENTION

The invention comprises a toroid shaped transponder unit for sensing the operating temperature and current through a power transmission line and includes a hub and concentric spoke mounting arrangement for housing the temperature sensor unit without altering the thermodynamics of the transmission line. The unit is initially connected to an energized power transmission line by means of a spring-loaded hinge mechanism and then is firmly tightened by an insulated tool. The ultrahigh frequency transmitter allows a compact minature patch-type or disk antenna to be attached to the exterior of the unit.

BRIEF DESCRIPTION OF THE DRAWINGS

FIG. 1 is a side view of a prior art transponder unit attached to a power transmission line;

FIG. 2 is a diagrammatic representation of the electronic circuitry employed with the unit of FIG. 1;

FIG. 3A is a top perspective view of the transponder unit of the invention prior to attachment to a power transmission line;

FIG. 3B is a top perspective view of the open frame mounting hub and spoke arrangement of the transponder unit shown in FIG. 3A;

FIG. 4 is a top perspective view of the transponder unit of FIG. 3A attached to a power transmission line;

FIG. 5 is an enlarged cross-sectional view of the transponder unit shown in FIG. 4;

FIG. 6 is an end view of the transponder unit shown in FIG. 4; and

FIG. 7 is a diagrammatic representation of the electronic circuit employed with the transponder unit depicted in FIG. 4.

DESCRIPTION OF THE PREFERRED EMBODIMENT

A better understanding of the transponder unit of the invention can be attained by first referring to FIG. 1 wherein a prior art transponder 10 consisting of a closed loop housing 11 attached to a power transmission line 12 by means of a housing clamp 13 is shown. Transponder 10 includes a transmitter and power supply housing 14 forming part of the loop housing 11 and a radio frequency antenna 15 which is secured to transmission line 12 by means of an insulated antenna clamp 16. Antenna 15 generally extends for approximately 150 inches to antenna clamp 16. The loop housing 11 is generally an oval shape in the order of two by four feet. The thermocouple 6 is located approximately 36 inches from hub 13 and held in place by clamp 16. Because of the mechanism employed for attaching antenna clamp 16 and housing clamp 13, transmission line 12 must first be de-energized in order not to cause any electrical shock hazard to the installer.

The power supply and transmitter circuit 17 shown in FIG. 2 is contained within transmitter and power supply housing 14 in FIG. 1. Circuit 17 is an analog circuit which includes a modulator unit connected to a temperature sensor located within housing clamp 13 and contacting transmission line 12 to determine the temperature of transmission line 12 during periods of operation. A standard radio frequency transmission circuit is included within the transmitter and is connected to antenna 15 for transmission to a nearby receiver generally within fifty feet of transmission line 12. The power supply within circuit 17 is a conventional miniaturized power supply which derives its power from the electricity generated within loop housing 11 which intercepts a portion of the air flux or magnetic field emanating from transmission line 12.

Transponder unit 9, according to the invention, can be seen by referring to FIG. 3A wherein toroid housing 21 is shown partially encompassing transmission line 12 in an open position. Housing 21 contains a power coil 22 having its own magnetic core (not shown) a plurality of electronic components 24 and a Rogowski coil 23, for sensing current, all encapsulated within insulation 25. Connecting to the inner portion of housing 21 are four extending spokes 18 connected with a common hub 19. Housing 21 is hinged at one section by means of a combination of spring 26 and hinge 8. A trip mechanism 27 is operably connected with spring 26 to cause both halves 21A, 21B of housing 21 to come into contact when trip mechanism 27 comes in contact with transmission line 12. Thermal sensor unit 20 attached to one end of spoke 18 comes into thermal contact with transmission line 12 for the purpose of sensing the heat generated with transmission line 12. Current sensing coil 23 is a Rogowski type coil which generates current in response to the magnetic field exisitng around transmission line 12 and provides an indication of the magnitude of current passing through transmission line 12. The relationship between open frame mounting hub 19 and spokes 18 relative to transmission line 12 is shown in FIG. 3B to contain a plurality of vents 28 around the circumference of mounting hub 19. The purpose of vents 28 and the spacing between spokes 18 allows the thermal sensor 20 to come into thermal contact with transmission line 12 without removing heat from transmission line 12. The arrangement of spokes 18 around hub 19 and the provision of vent 28 within hub 19 allow the free transport of ambient air and prevents the buildup of heat within the opened center region of housing 21 that surrounds transmission line 12. The arrangement of spokes 18 and mounting hub 19 is an important feature of this invention since the removal of heat from transmission line 12 could result in an erroneous indication of the actual temperature of transmission line 12.

A transmission line 12 having transponder 9 attached is shown in FIG. 4 with hub 19 and radial spokes 18 centrally located within the space 7 formed within the interior of housing 21 which contains thermal sensor 20. The provision of the spring 26, hinge 8 and trip mechanism 27, shown in FIG. 3A, allows transponder 9 to be attached when transmission line 12 is energized without causing any electrical hazard problems to the installer. Transponder 9 can be connected to one end of a "hot stick" and brought into contact with transmission line 12 whereby transmission line 12 contacts trip mechanism 27 causing spring 26 to become operational in the manner described earlier. The unit is then firmly secured to line 12 by an insulated tool and internal mechanism (not shown).

The internal arrangement of electronic components 24, sensing coil 23 and power coil 22 within housing 21 can be seen by referring now to FIG. 5. The electronic components 24, sensing coil 23 and power coil 22 are encapsulated within an insulation material 25 which is contained within housing 21. Housing 21, spokes 18 and hub 19 can be fabricated from a conductive material, such as aluminum, without disrupting the transmission of electric power through line 12. Since the entire transponder 9 is at the same electrical potential difference existing between transponder 9 and transmission line 12. Thermal sensor 20 comprises a transducer such as a thermal integrated circuit, thyristor or thermocouple which generates an electrical signal in proportion to the heat generated within transmission line 12. Vents 28 existing within hub assembly 19 which includes cross members 19A (FIG. 3B) provide for the passage of ventilating air within hub 19 and within space 7 (FIG. 4) defined by housing 21 around transmission line 12. As described earlier, the radial placement of spokes 18 and hub 19 such that only hub rings 4 contact transmission line 12 assures that transponder 9 will not act as a "heat sink" and take heat away from the vicinity of thermal sensor 20 to result in erroneous readings. Power coil 22 and current sensing coil 23 as well as electronic components 24 are shown encapsulated within insulation 25 as described earlier. A patch antenna 29 consisting of a thin layer of pliable metal material is attached to the exterior of housing 21 by means of a thin film of insulating adhesive 5. Patch antenna 29 is electrically coupled with an ultra high frequency (UHF) transmitter contained within the electronic component 24 which will be described below in greater detail. Electrical signals corresponding to the temperature sensed by thermal sensor 20 and electrical signals corresponding to the power transmitted through transmission line 12 and sensed by sensing coil 23 are transmitted to a receiver by means of the UHF transmitter in combination with antenna 29.

The symmetric relationship existing between transponder 9 and transmission line 12 is shown in FIG. 6 wherein spokes 18 and hub 19 radially surround transmission line 12 and thermal sensor 20 intimately contacts transmission line 12. Thermal sensor 20 may contain a spring mechanism within spoke 18 to hold sensor 20 in good thermal contact with transmission line 12 in order to insure consistent and accurate temperature readings. Trip mechanism 27 as well as spring 26 and hinge 8 are also shown in operative relationship within housing 21 when transponder 9 is in a closed position around transmission line 12. Also shown in patch antenna 29 adhesively attached to the outer surface of housing 21 as described earlier.

The electrical connection between thermal sensor 20 and current sensor 23 with electronic components 24 is shown in FIG. 7 as follows. Thermal sensor 20 electrically connects through an analog to digital logic converter A/D to a shift register, integrator and modulator. The modulated signal input data is then fed into a transmitter for transmitting to patch antenna 28. An oscillator is used to generate UHF signals from antenna 28. Signals generated by current sensor 23 are fed into an analog to digital converter unit A/D and from there to the same shift register, integrator, modulator and transmitter to antenna 28. The electronic components comprising the analog to digital converter, shift register, integrator, modulator, oscillator and transmitter are standard units readily available from electric suppliers. A complete converter, register, integrator, modulator and transmitter unit can be obtained from Repco, Inc. of Orlando, Fla., as one example. Thermal sensor 20 can comprise a thermistor, thermal integrated circuit, or thermocouple unit as described earlier and current sensor 23 can comprise a Rogowski coil as is commonly used to sense current external to a current source.

What is claimed as new and which it is desired to secure by Letters Patent of the United States is:

1. A method for monitoring the operating temperature of a power transmission line comprising the steps of:
   separating the two halves of a circular housing containing a temperature sensor and a spring loaded trip mechanism;
   at least partially encompassing a power transmission line with said two housing halves;
   contacting said trip mechanism with said transmission line causing said spring to force the two halves into contact and to cause said temperature sensor to come in thermal contact with said power transmission line.

2. The method of claim 1 including the step of securing said two housing halves to each other and to said transmission line.

3. A transponder unit for monitoring the conductor temperature of a power transmission line, said transponder unit comprising, in combination:

A. a toroidal-shaped, conductive housing consisting of two semi-annular housing sections;
B. a cylindrical hub consisting of two semi-annular hub sections;
C. angularly spaced spokes separately interconnecting said hub sections to said housing sections;
D. a hinge mechanism interconnecting said housing sections for swinging movement between a relatively open position to admit a transmission line to the open interior of said hub and a relatively closed position with said hub embracing the transmission line to mount said transponder unit thereon;
E. at least one temperature sensing probe carried by said housing and extending radially through an opening in said hub into thermally coupled relation with the transmission line; and
F. electronic signal transmission means accommodated in said housing for wireless communication to a remote location of conductor temperature data obtained by said probe.

4. The transponder unit defined in claim 3, wherein said hub sections are apertured to ventilate the interior of said hub.

5. The transponder unit defined in claim 3, which further includes an annular magnetic sensing coil mounted within said housing for providing an indication of the current flowing in the transmission line.

6. The transponder unit defined in claim 3, which further includes an iron core split loop mounted within said housing and linked with the electromagnetic field associated with the flow of current in the transmission line, and a secondary winding on said core in which is induced operating voltage for said signal transmission means.

* * * * *